US007788563B2

(12) United States Patent
Andreev et al.

(10) Patent No.: US 7,788,563 B2
(45) Date of Patent: Aug. 31, 2010

(54) GENERATION OF TEST SEQUENCES DURING MEMORY BUILT-IN SELF TESTING OF MULTIPLE MEMORIES

(75) Inventors: Alexandre E. Andreev, San Jose, CA (US); Anatoli A. Bolotov, Cupertino, CA (US); Ranko Scepanovic, Saratoga, CA (US)

(73) Assignee: LSI Corporation, Milpitas, CA (US)

( * ) Notice: Subject to any disclaimer, the term of this patent is extended or adjusted under 35 U.S.C. 154(b) by 253 days.

(21) Appl. No.: 12/142,912

(22) Filed: Jun. 20, 2008

(65) Prior Publication Data
US 2009/0316507 A1    Dec. 24, 2009

(51) Int. Cl.
*G01R 31/28* (2006.01)
(52) U.S. Cl. .................. 714/733; 714/719
(58) Field of Classification Search ............ 365/230.05, 365/201; 714/718, 724, 30, 733, 719
See application file for complete search history.

(56) References Cited

U.S. PATENT DOCUMENTS

| | | | | |
|---|---|---|---|---|
| 5,742,557 A * | 4/1998 | Gibbins et al. | ......... | 365/230.05 |
| 5,896,330 A * | 4/1999 | Gibson | ................ | 365/201 |
| 6,070,256 A * | 5/2000 | Wu et al. | ................ | 714/718 |
| 6,288,969 B1 * | 9/2001 | Gibbins et al. | ......... | 365/230.05 |
| 6,681,358 B1 * | 1/2004 | Karimi et al. | ............... | 714/733 |
| 7,010,736 B1 * | 3/2006 | Teh et al. | ................ | 714/733 |
| 7,139,204 B1 * | 11/2006 | Behera | ................ | 365/201 |
| 7,653,854 B2 * | 1/2010 | Anzou et al. | ............... | 714/733 |
| 2008/0077834 A1 * | 3/2008 | Khoche et al. | .............. | 714/732 |

* cited by examiner

*Primary Examiner*—David Ton
(74) *Attorney, Agent, or Firm*—Christopher P. Maiorana, PC

(57) ABSTRACT

The present invention concerns an apparatus including a modular memory and an address locator circuit. The modular memory may be configured to generate a current address signal, a first data output signal and a second data output signal in response to a first port address signal, a second port address signal, an initial state parameter, a target state parameter, a first port enable signal, a second port enable signal, a write enable signal, a data input signal, a first location signal and a second location signal. The address locator circuit may be configured to generate the first location signal and the second location signal in response to the first port address signal, the second port address signal and the current address signal.

20 Claims, 4 Drawing Sheets

GENERATION OF TEST SEQUENCES DURING MEMORY BUILT-IN SELF TESTING OF MULTIPLE MEMORIES

FIELD OF THE INVENTION

The present invention relates to memory architectures generally and, more particularly, to a method and/or apparatus for generating test sequences during memory built-in self testing (MBIST) of multiple memories.

BACKGROUND OF THE INVENTION

Testing of very large scale integration (VLSI) designs becomes more common with the growth of the complexity of such designs. Testing should be very accurate to reduce the number of non-detected faults. Testing should also be fast and inexpensive in terms of hardware and software overhead. An especially important task is the testing of memories. In the synthesis of VLSI designs, memories in the designs have a much higher defect density than other logic and thus involve additional and comprehensive testing. To reduce the size of a memory, gates and wires are typically placed very densely on a semiconductor wafer. Dense placement often results in a significantly higher ratio of faults (i.e., up to 4 times higher) in these areas.

Fortunately, memories are very regular structures, so testing can be done on-chip, based on data sequences generated by relatively small processors. One conventional solution is to test memories using a built-in memory test (MT) controller that performs corresponding MT schemes. During a test, the MT controller sends input data, usually to a memory collar, along with expected memory output data in order to perform a comparison with the actual memory output data at each time a comparison is to be performed. The expected memory output data can be computed/predicted at the test process level (rather than in the MT controller). However, computation/prediction of the expected memory output data at the test process level can be memory dependent. In the case of a 2-port memory, when reading through port B, data stored in the memory at an address ADRB can appear to be adjusted to an address ADRA associated with port A. In this case, the adjusted addresses depend on the memory column multiplexing and how the address ADRB is generated. Such an implementation can be cumbersome because the MT controller needs to provide a large amount of test specific information that can require additional wires between the MT controller and the memory collar.

It would be desirable to implement a system and/or method that may be used to test memories of different sizes and types without being cumbersome or requiring additional wires between the MT controller and the memory collar.

SUMMARY OF THE INVENTION

The present invention concerns an apparatus including a modular memory and an address locator circuit. The modular memory may be configured to generate a current address signal, a first data output signal and a second data output signal in response to a first port address signal, a second port address signal, an initial state parameter, a target state parameter, a first port enable signal, a second port enable signal, a write enable signal, a data input signal, a first location signal and a second location signal. The address locator circuit may be configured to generate the first location signal and the second location signal in response to the first port address signal, the second port address signal and the current address signal.

The objects, features and advantages of the present invention include providing a method and/or apparatus for generating test sequences during memory built-in self testing (MBIST) of multiple memories that may (i) provide a modular approach, (ii) reduce complexity for implementations, (iii) provide at-speed testing, (iv) support memory test controllers that are memory type and size independent, (v) support programmable and downloadable memory test controllers, (vi) provide a flexible solution, (vii) be extendable to more comprehensive memory test methods and/or (viii) test multiple memories of different sizes and types in parallel.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
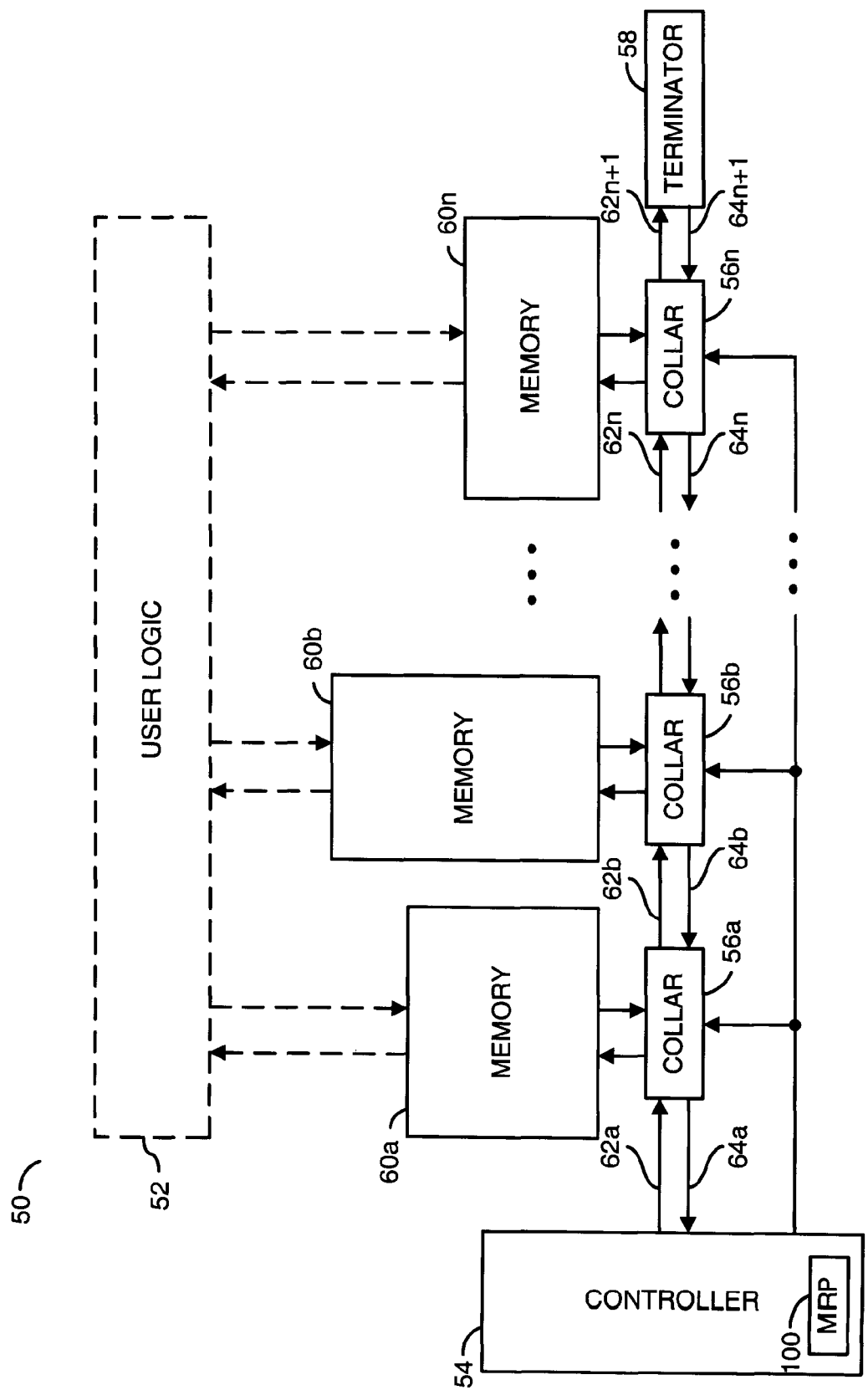
FIG. 1 is a diagram illustrating a context of the present invention.

Referring to FIG. 1, a block diagram of a system 50 is shown in accordance with a preferred embodiment of the present invention. The system 50 generally comprises a block (or circuit) 52, a block (or circuit) 54, a number of blocks (or circuits) 60a-60n, a number of blocks (or circuits) 56a-56n and a block (or circuit) 58. In one example, the circuit 52 may be implemented as a user logic circuit. The circuit 54 may be implemented as a controller circuit. The circuits 56a-56n may be implemented as collar circuits. The circuit 58 may be implemented as a terminator circuit. The circuits 60a-60n may be implemented as memory circuits. In one example, the controller circuit 54 may be implemented as a BIST circuit. The controller circuit 54 may be a common controller used with each of the memory circuits 60a-60n. The controller circuit 54 may include a block (or circuit) 100. The circuit 100 may be implemented as a memory response prediction module.

The system 50 may be implemented as part of a MBIST chain architecture. For example, the memory circuits 60a-60n may form a chain. A number of busses 62a-62n and 64a-64n may be implemented to couple the controller circuit 54 and the collar circuits 56a-56n. The busses 62a-62n and 64-64n may be implemented having moderate width (e.g., 8-10 bits). However, other bit-widths may also be implemented. The busses 62a-62n and 64a-64n may be connected to form a chain. The controller 54 may be on one side of the chain. The terminator circuit 58 may be coupled on another side of the chain via busses 62n+1 and 64n+1. The busses 62n+1 and 64n+1 are generally implemented similarly to the busses 62a-62n and 64a-64n, respectively.

Each of the collar circuits 56a-56n may be configured to operate with a particular one of the memory units 60a-60n. The collar circuits 56a-56n may be implemented to allow the various memory circuits 60a-60n to operate with the common controller 54. For example, the collar 56a may operate with the memory 60a, the collar 56b may operate with the memory circuit 60b, etc. Examples of circuits that may be used to implement the collar circuits 56a-56n may be found in co-pending U.S. patent application Ser. Nos. 61/056,172 and 61/056,246, filed May 27, 2008, and U.S. Patent Application Ser. No. 61/059,882, filed Jun. 9, 2008, which are herein incorporated by reference in their entirety. The structures and/or size of the memory circuits 60a-60n may be varied to meet the design criteria of a particular implementation. For example, the memory circuits may be implemented as a SRAM memory, a 1-port memory, a 2-port memory, or other type and/or combination of memory. The length of particular busses 62a-62n and 64a-64n connecting the neighboring collars 56a-56n (or the controller 54 and the nearest one of the collars 56a-56n) is not normally a critical parameter and may be varied. An MBIST chain architecture normally permits splitting long connections into smaller pieces by adding flip-flop boundaries between such connections.

The present invention may provide a memory test (MT) memory response prediction module 100 that may be embedded into a Memory Built-In Self Test (MBIST) controller to perform comprehensive memory testing. The memory response prediction module 100 may provide expected read and/or write sequences that may be used to compare with the actual read and/or write sequences sent and/or received from the memory circuits 60a-60n. The memory response prediction module 100 may be used to generate test sequences that may be used in march type testing schemes. The memory response prediction module 100 may also be used while decoding MBIST output data in a diagnostic mode.

For example, the memory response prediction module 100 may provide a simple testing module that may predict the data presented from the memory (or memories) being tested with the controller 54 (e.g., an MBIST controller) in accordance with one or more march type testing processes embedded (or downloaded) into the controller 54. The memory response prediction module 100 may provide a modular reduction of the memory (or memories) under test by implementing an ideal (or abstract) memory model that may describe a variety of possible memory sizes and/or types that may be tested with the march type testing processes. The particular march type test may also be varied. The memory response prediction module 100 may comprise a factor memory model that models the test behavior (e.g., memory responses for test inputs when applying a test sequence of the march type) of the actual memories 60a-60n implemented. The memory model may model the behavior of the actual memories 60a-60n up to certain isomorphic transformations of the memory data and addresses. The factor memory model provided by the memory response prediction module 100 generally eliminates possible differences between the actual memories 60a-60n related to different memory sizes, types, number of ports, input/output interfaces, etc.

The present invention may provide a low complexity implementation method for providing the memory response prediction module 100 that may predict an output of one or more memories under test with march type memory testing sequences. During testing, the controller 54 normally sends test input data, usually to one of the memory collars 56a-56n, along with expected (or predicted) memory output data in order to perform comparison with the actual memory output data at a time when a comparison needs to be performed. For an expected data computation, the memory response prediction module 100 may be embedded into the memory testing controller 54. In general, the memory response prediction module 100 simultaneously serves all of the memories 60a-60n in the MBIST chain architecture 50.

The memory response prediction module 100 may allow (i) at speed parallel testing on a chip, (ii) testing multiple memories of different sizes and types, even when generated with different memory compilers, and/or (iii) easy implementation and easy extension to desired built-in family of memory tests. The memory response prediction module 100 may provide one or more of the following advantages (i) support of MT controllers that are memory type and size independent, (ii) support of programmable and downloadable MT controllers, (iii) flexibility, (e.g., may be extended to the more comprehensive memory test patterns), and/or (iv) low complexity (e.g., implemented with only minor logic around small factor pseudo-memory with a couple of flip-flops in the netlist).

Memory testing of the memories 60a-60n with march type sequences (or some other tests) generally involves a memory test controller computing (predicting) expected values that would be generated from the memories 60a-60n in response to the test sequences when no errors have occurred. In one example, the expected values may be presented by the memory test controller 54 as an expected test data output signal (e.g., TDO_EXP) for the memories 60a-60n along with respective input test value signals (e.g., TWE, TDI and CMP). The signal TWE may comprise a test write enable signal. The signal TDI may comprise a test data input signal. The signal CMP may comprises a control signal indicating whether a comparison between the output of the memory under test is to be compared with the expected values presented by the expected test data output signal TDO_EXP. The signals TDO_EXP, TWE, TDI and CMP are normally sent to the memories 60a-60n through a channel (e.g., the busses 62a-62n) for performing an operation with the memories 60a-60n and for comparison of the actual data generated with the expected values. In one example, the data sent to the memories 60a-60n (both for memory input and expected for output) are usually sent in a compressed (or coded) format that is expanded (or decoded) in the memory collar circuits 56a-56n. For example, data sent to the memory collars 56a-56n may appear as several 2-bit (or even 1-bit) vectors (mentioned above) that may be coupled together in a larger vector (e.g., TEST_DATA). For example, the larger test vector may be 8-10 bits.

For computing the expected values contained in the signal TDO_EXP, a copy of the particular memory under test could be instantiated in the memory test controller 54. Including a copy of the particular memory under test in the memory test controller 54 would generally provide the best and most accurate solution for the computation of the expected values when testing the particular memory if the size of the memory is not taken into account. However, instead of instantiating a copy of the particular memory, a homomorphous memory image of the memory under test may be generated. The homomorphous memory image may significantly reduce the effective memory size being tested by the memory controller 54 by providing a factor (or reduced) memory that remains equivalent to the original memory (or memories) under test relative to a given set of actions performed with the memory.

Such a reduction may be accomplished because the process of memory testing is generally a process of rewriting (and checking) the content of the memory from one very regular pattern (e.g., initial state) to another regular pattern (e.g., target state). In addition, such memory testing is generally performed with a very regular movement along regular routes in the memory address space.

The actual test march routes generally take into consideration such important actual memory and testing sequence characteristics as column multiplexing, different possible march routes, possible data transformations (e.g., checkerboard data, etc.), and other specific memory and test pattern attributes. When using a factor memory in accordance with the present invention for testing, actual test march routes generally do not need to be considered because a one-to-one correspondence may be set between, from the one side, factor memory data, attributes and parameters in the memory test controller 54 and, from the other side, the actual memory and test pattern characteristics in the collars 56a-56n. All necessary data and parameter transformations may be performed in the memory collars 56a-56n.

Figure 2:
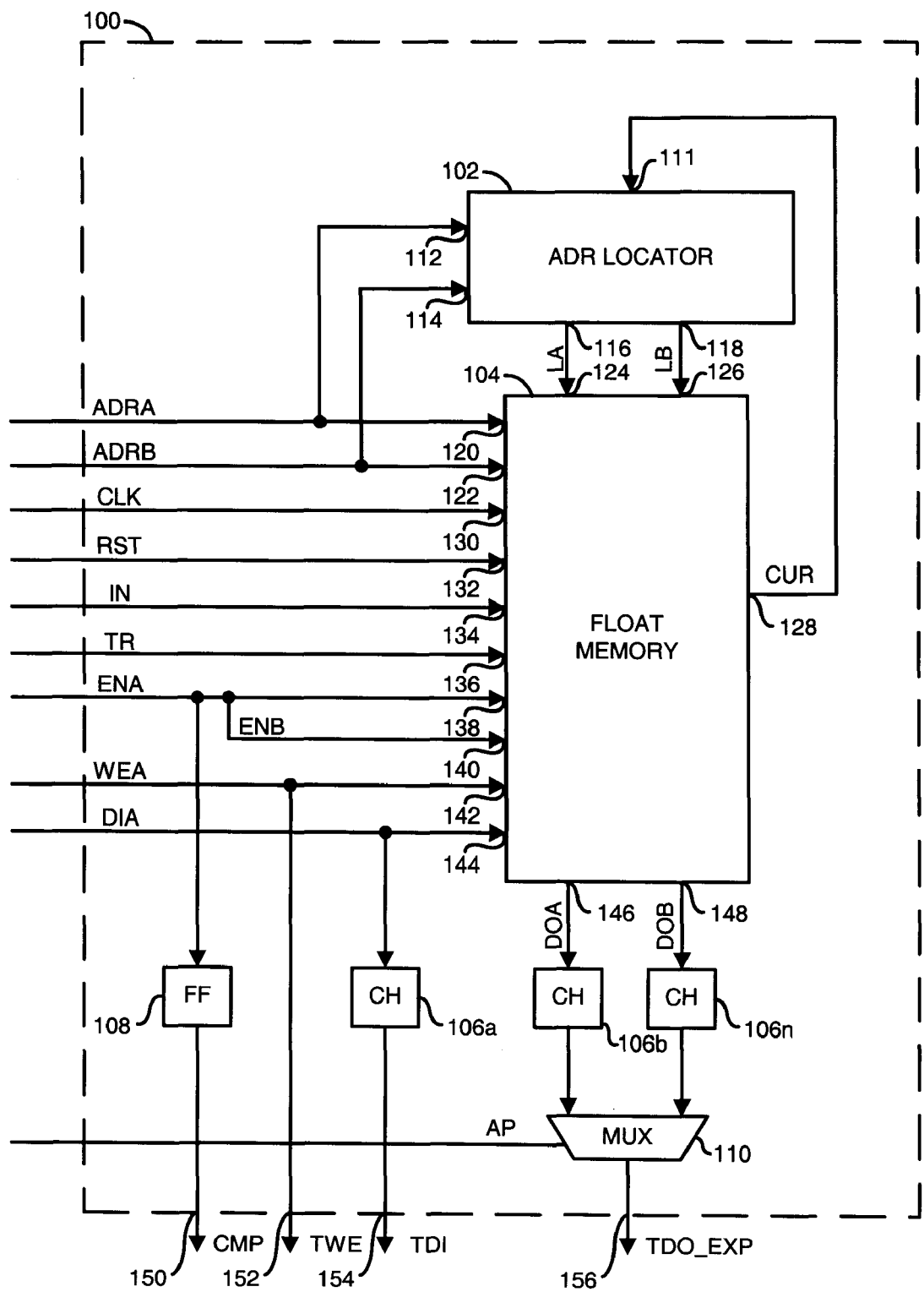
FIG. 2 is a diagram illustrating a memory response prediction module in accordance with an embodiment of the present invention.

Referring to FIG. 2, a diagram is shown illustrating an example memory response prediction module 100 in accordance with a preferred embodiment of the present invention. The memory response prediction module 100 generally comprises a block (or circuit) 102, a block (or circuit) 104, a number of blocks (or circuits) 106a-106n, a block (or circuit) 108, and a block (or circuit) 110. The circuit 102 may be implemented as an address locator circuit. The circuit 104 may be implemented as a float modular memory circuit. The circuits 106a-106n may be implemented as checkerboard circuits. The circuit 108 may be implemented as a flip-flop circuit. The circuit 110 may be implemented as a multiplexer circuit.

The address locator circuit 102 may have an input 111 that may receive a signal (e.g., CUR), an input 112 that may receive a signal (e.g., ADRA), an input 114 that may receive a signal (e.g., ADRB), an output 116 that may present a signal (e.g., LA), and an output 118 that may present a signal (e.g., LB). The float modular memory circuit 104 may have an input 120 that may receive the signal ADRA, an input 122 that may receive the signal ADRB, an input 124 that may receive the signal LA, an input 126 that may receive the signal LB, an output 128 that may present the signal CUR, an input 130 that may receive a signal (e.g., CLK), an input 132 that may receive a signal (e.g., RST), an input 134 that may receive a signal (e.g., IN), an input 136 that may receive a signal (e.g., TR), an input 138 that may receive a signal (e.g., ENA), an input 140 that may receive a signal (e.g., ENB), an input 142 that may receive a signal (e.g., WEA), an input 144 that may receive a signal (e.g., DIA), an output 146 that may present a signal (e.g., DOA), and an output 148 that may present a signal (e.g., DOB). The circuit 100 may have an output 150 that may present a signal (e.g., CMP), an output 152 that may present a signal (e.g., TWE), an output 154 that may present a signal (e.g., TDI), and an output 156 that may present a signal (e.g., TDO_EXP). The circuit 108 may present the signal CMP in response to the signal ENA. The signal TWE may be generated from the signal WEA. The circuit 106a may generate the signal TDI in response to the signal DIA. The multiplexer 110 may receive a control signal (e.g., AP). The multiplexer circuit 110 may be configured to select between the signal DOA and the signal DOB for presentation as the signal TDO_EXP in response to the signal AP.

The circuit 100 generally includes a float modular memory that may provide a factor memory that may be used in the controller to predict memory output data. The circuits 106a-106n may be implemented as auxiliary modules. The circuits 106a-106n may perform a checkerboard (e.g., swapping) transformation of two bits (if needed). The signal AP may be implemented as an active port flag that may choose the port being tested in the current phase of testing. The signal CMP may be implemented as a compare signal. In one example, the signal CMP may be generated as a delayed version of the enable signal ENA by the flip-flop 108. In one example, the flip-flop 108 may provide one clock cycle of delay. However, other delays may be implemented to meet the design criteria of a particular implementation.

Figure 3:
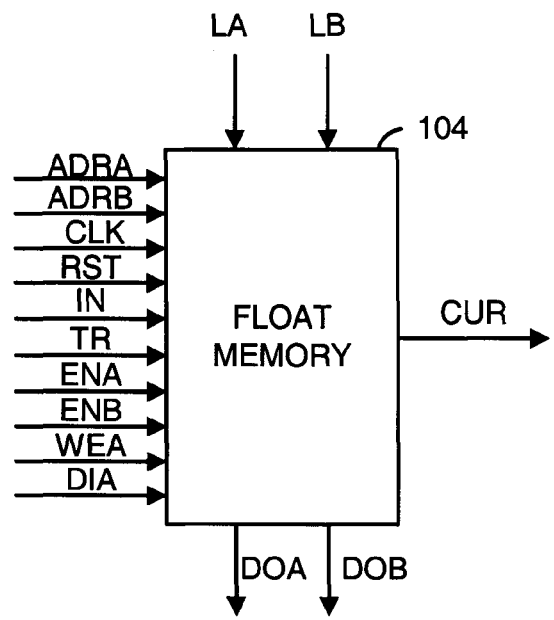
FIG. 3 is a diagram illustrating a float modular memory.

Referring to FIG. 3, a diagram of the float modular memory 104 is shown. The float modular memory 104 may appear similar to a regular 2-port, 2-bit memory storing regular (e.g., periodic) data (e.g., patterns). Because of the very simple nature of the float modular memory 104, the periodic patterns stored within and the manner in which data is written and read, the float modular memory 104 may be implemented, unlike a regular memory, with a few flip-flops and a tiny logic around them.

In general, at each clock cycle, each port (e.g., port A or port B) of a regular 2-port, 2-bit memory may be in an active (e.g., enabled) or inactive (e.g., disabled) state depending on the status (value) of a corresponding enable signal (e.g., ENA or ENB). For instance, when the port A is enabled (e.g., ENA=1) and a write-enable input signal (e.g., WEA) is also asserted (e.g., High or a logic "1") for each bit (e.g., WEA=(11)), 2-bit data presented at a data-input port (e.g., DIA) of the module is written into the memory location specified by an address presented at the input address port (e.g., ADRA). When the write-enable signal WEA is Low (or a logic "0") for each bit (e.g., WEA=(00)), 2-bit data stored at the memory location specified by the signal at the input address port ADRA is outputted through the data-output port (e.g., DOA) of the module. During a partial bit write operation (e.g., when WEA=(01) or WEA=(10)), corresponding read or write operations are performed on the bit basis with the corresponding data input/output bits.

Unlike a majority of regular 2-port memories, the float modular memory 104 is not symmetrical. For example, the port A is normally used for both read and write operations and the port B is normally used only for read operations. The read operations involving the port B occur whenever the port B is enabled. The port A is generally referred to as an active port. The port B is generally referred to as a passive port. Similar to the regular memory, the float modular memory 104 may be used for writing or reading data through the active port A and for reading data through the passive port B. However, the read and write operations are normally performed in a particular way, namely "modulo" last 3 address bits (mod 8). For example, only the last 3 (e.g., least significant) address bits may be used in operations with the float modular memory 104.

The signal CUR may comprise information from a special frontier address (e.g., also referred to as CUR (or Current)) of the float modular memory 104. The special frontier address CUR stores the address of the last write operation performed with the memory under test. Also, a 2-bit memory frontier (MF) value at the address CUR is stored. When the float modular memory is reset (e.g., when the signal RST is set High or to a logic "1"), the address CUR is set to 0, and the signal MF is set to the initial state input signal (e.g., IN). Between two resets, the external initial state input signal IN and the external target state input signal (e.g., TR) are generally maintained in a constant state.

Testing of a regular memory with march tests is normally a process of rewriting (and checking) contents of the memory from one regular pattern (e.g., the initial state) to another regular pattern (e.g., the target state). Filling out the memory normally involves a process of regular and periodic floating movement (e.g., march) along a route of addresses, along with rewriting an initial pattern to a specified target pattern. From a general point of view, the content of the memory under test at each intermediate step of testing may appear as follows:

(TR, TR, . . . ,TR, $MF_1$, . . . ,$MF_n$, IN, . . . ,IN, IN).

Thus, one phase of testing of the march type looks like a wave moving from the one side of the memory to another, where n represents a frontier width of the wave. With such a specific memory usage, a model of the memory under test may be reduced to the float modular memory 104 that is able (i) to store the front of the wave, (ii) to make read or write/rewrite operations with the frontier of the wave only, and (iii) outside of the front window (but close enough to the front window) to perform only read operations. In one example, the frontier width (or capacity) n may be set equal to 1 and the 3 least significant address bits may be chosen to determine whether a particular address is located relatively close to the front of the wave. In the example with n=1 and using the 3 least significant address bits, the operations with the front of the wave appear to be, for example, operations with a floating raft moving along the address chain, when taking into account the position and contents of the floating raft (hence the term float modular memory).

More formally, operations with the floating modular memory 104 may be performed as follows:

1. Reset:
   if RST=1 then CUR=0, MF=IN;
2. Write through port A (when port A enabled):
   CUR=ADRA,
   MF=DIA&WEA \/MF&~WEA.
3. Read through port A (when port A enabled):
   if ADRA<CUR then DOA=IN;
   if ADRA=CUR then DOA=MF;
   if ADRA>CUR then DOA=TR;
4. Read through port B (when port B enabled):
   if ADRB<CUR then DOB=IN;
   if ADRB=CUR then DOB=MF;
   if ADRB>CUR then DOB=TR;

Similar operations may be outlined in a more general case of a larger floating capacity and more complex march pattern movement as well. The floating modular memory 104 may be easily generalized to more general cases also (e.g., with an increase of the module size). The locations represented by the address signals ADRA and ADRB relative to the current memory address CUR may be computed in an ADR LOCATOR module (described below in connection with FIG. 4).

Figure 4:
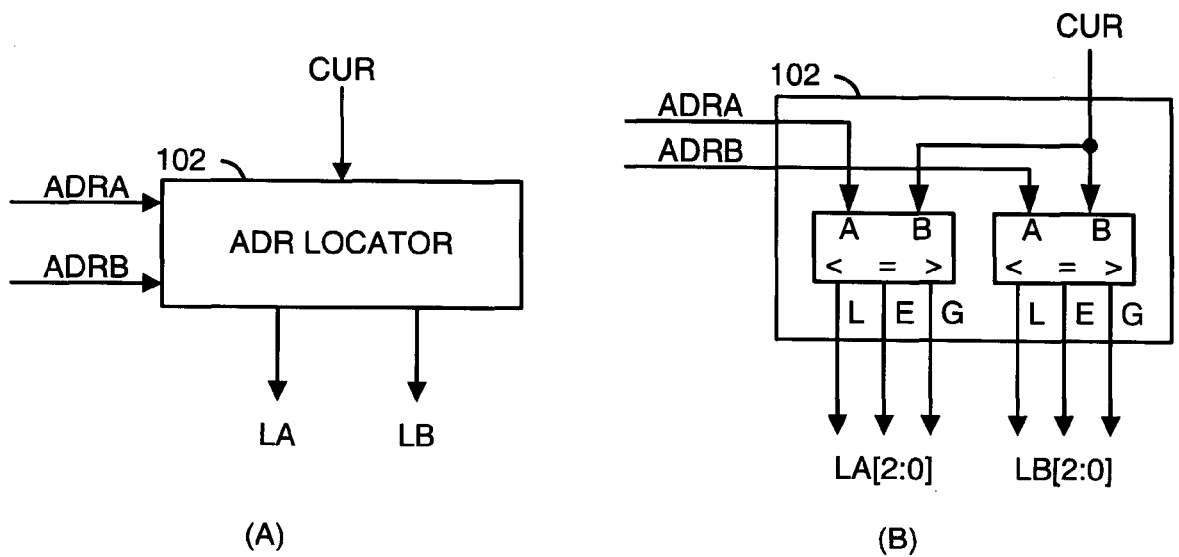
FIG. 4 is a diagram illustrating an address locator.

Referring to FIG. 4, a block diagram (FIG. 4A) and a logic diagram (FIG. 4B) are shown illustrating an example of the address locator circuit 102 in accordance with a preferred embodiment of the present invention. The circuit 102 normally determines a position of the memory address presented by the signals ADRA and ADRB relative to the address of the last write operation performed on the memory under test as presented by the signal CUR of the float modular memory 104. The computations are normally performed in mod 8 (e.g., only 3 last (less significant) bits of the address are used in comparisons performed within the module).

For given address signals ADRA and CUR, a 3-bit output representing a location A is computed (e.g., LA[2:0]=(L, E, G), where L means that ADRA<CUR, E means that ADRA and CUR are equal, and G means that ADRA>CUR). A 3-bit output LB[2:0] (location B) is computed similarly for the pair of addresses ADRB and CUR. In a preferred embodiment, the addresses may be implemented such that ||ADRA−CUR||<4 and |ADRB−CUR|<4 to allow the mutual locations of the addresses to be correctly compared even when only the 3 last addresses bits are used. For example, 2=(010)<5=(101), but 2=(010)>7=(111). In other words, the numbers 0, 1, ..., 7 are written in a circle, and for a given two numbers a and b, a 4-number window along the circle that contains both a and b is found, and then moving in a clockwise direction in that window, a determination is made whether a<b or vice versa. Addresses in invalid cases (e.g., ||a−b||≧4) are generally not compared. For example, the case where a=0=(000) and b=4=(100) is generally treated as an error.

Figure 5:
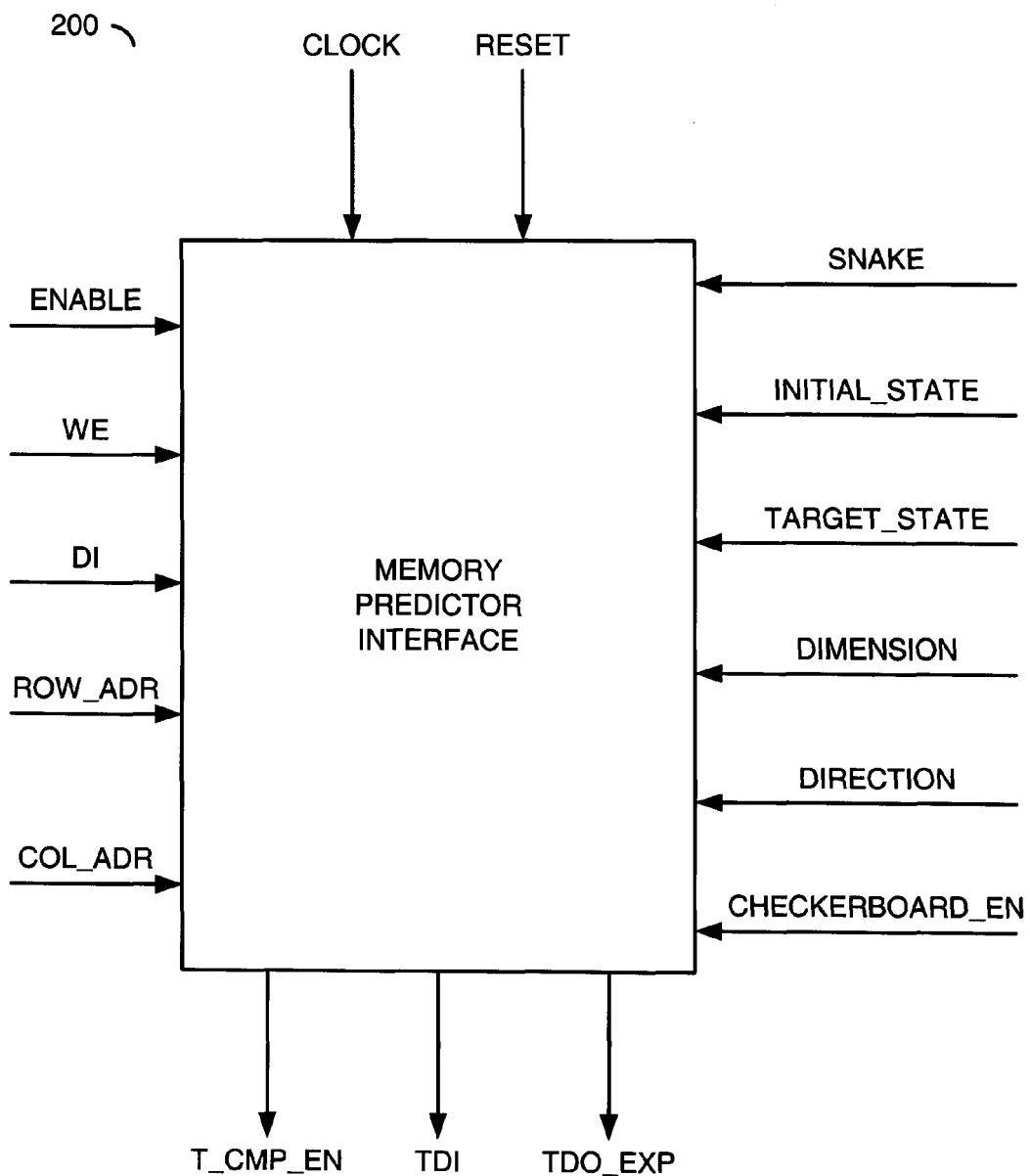
FIG. 5 is a diagram illustrating a memory response predictor interface in accordance with the present invention.

Referring to FIG. 5, a diagram is shown illustrating an interface 200 in accordance with the present invention. The interface 200 may be implemented to couple the memory test controller 54 with the memory response prediction module 100. In one example, the interface 200 may have a number of first inputs that may receive a number of parameters (e.g., SNAKE, INITIAL_STATE, TARGET_STATE, DIMENSION, DIRECTION, CHECKBOARD_EN), a number of second inputs that may receive a number of signals (e.g., ENABLE, WE, DI, ROW_ADR and COL_ADR), a third input that may receive a signal (e.g., CLOCK), a fourth input that may receive a signal (e.g., RESET) and a number of outputs that may present a number of signals (e.g., T_CMP_EN, TDI and TDO_EXP). The parameters SNAKE, INITIAL_STATE, TARGET_STATE, DIMENSION, DIRECTION, CHECKBOARD_EN may be associated with an MBIST march type test to be performed by the controller 54 on one or more of the memories 60a-60n. In one example, the parameters INITIAL_STATE and TARGET_STATE may determine memory content before and after the test is performed (e.g., all 0 for initial, and all 1 in the end). The parameters SNAKE, DIRECTION and DIMENSION may determine the route along the addresses (e.g., from address 0 to the last address or from the last address to address 0; sequentially along memory rows or along columns). The parameter CHECKBOARD_EN may determine that test patterns should be checkerboard-style.

The signal ENABLE may comprise a memory enable signal. The signal WE may comprise a control signal configured to enable a write operation. The signal DI may comprise input data to be written into memory. The signals ROW_ADR and COL_ADR may comprise the address of the current location for a floating cross-shaped window that is moving along the trajectory over the actual memory array under test. For example, the signals ROW_ADR and COL_ADR are determined modulo 8 (e.g., the addresses are 3-bits wide) and therefore only determine a spot or window in the actual memory array.

The signal TDI may comprise test data to be sent by controller 54 through the busses 62a-62n to be written via the collars 56a-56n into each of the memories 60a-60n under test in the MBIST memory chain 50. In general, all of the memories 60a-60n in MBIST memory chain 50 may be different in terms of size, capacity, number of ports, types, etc.). The signal TDO_EXP may comprise an expected data output (or hint) indicating what is predicted to be received from the memories 60a-60n in response to the test reading operations. Each of the collar circuits 56a-56n may use the hint differently, depending upon the particular characteristics of the memory connected to that collar circuit, to predict the correct output for a reading operation.

The signal T_CMP_EN may be implemented as a comparison enable flag. The signal T_CMP_EN may be sent from the memory response prediction module 100 to indicate to the collar circuits 56a-56n whether or not an output received from the respective memory is to be compared with the expected value contained in the signal TDO_EXP. For example, the signal T_CMP_EN may be use to determine whether to check reading operation data output only, rather than all memory outputs.

Because of the signals received at the number of second inputs (e.g., ENABLE, WE, DI, ROW_ADR and COL_ADR) and the number of signals (e.g., T_CMP_EN, TDI and TDO_EXP) presented at the number of outputs generally make, the interface 200 generally appears like a regular memory. The parameters received at the number of first inputs (e.g., SNAKE, INITIAL_STATE, TARGET_STATE, DIMENSION, DIRECTION, CHECKBOARD_EN) generally change with a switch to another MBIST march scheme. In one example, several march type MBIST tests may be supported. In one example, the parameters SNAKE, INITIAL_STATE, TARGET_STATE, DIMENSION, DIRECTION, CHECKBOARD_EN may be implemented as signals that adjust or specify particular MBIST march schemes used by the controller 54.

The various signals of the present invention are generally "on" (e.g., a digital HIGH, or 1) or "off" (e.g., a digital LOW, or 0). However, the particular polarities of the on (e.g., asserted) and off (e.g., de-asserted) states of the signals may be adjusted (e.g., reversed) to meet the design criteria of a particular implementation. Additionally, inverters may be added to change a particular polarity of the signals.

The various signals of the present invention are generally shown on individual inputs and outputs. In other embodiments, some or all of the various signals may be multiplexed through one or more inputs and/or outputs as desired or needed. The various signals of the present invention may be implemented as single-bit or multi-bit signals in a serial and/or parallel configuration.

As used herein, the term "simultaneously" is meant to describe events that share some common time period but the term is not meant to be limited to events that begin at the same point in time, end at the same point in time, or have the same duration.

As would be apparent to those skilled in the relevant art(s), the signals illustrated in FIGS. 15 may represent logical data flows. The logical data flows may be representative of physical data transferred between the respective blocks by, for example, address, data, and control signals and/or busses. The system represented by the circuit 100 may be implemented in hardware, software or a combination of hardware and software according to the teachings of the present disclosure, as would be apparent to those skilled in the relevant art(s).

While the invention has been particularly shown and described with reference to the preferred embodiments thereof, it will be understood by those skilled in the art that various changes in form and details may be made without departing from the scope of the invention.

The invention claimed is:

1. An apparatus comprising:
  a modular memory configured to generate a current address signal, a first data output signal and a second data output signal in response to a first port address signal, a second port address signal, an initial state parameter, a target state parameter, a first port enable signal, a second port enable signal, a write enable signal, a data input signal, a first location signal and a second location signal; and
  an address locator circuit configured to generate said first location signal and said second location signal in response to said first port address signal, said second port address signal and said current address signal.

2. The apparatus according to claim 1, wherein said modular memory and said address locator are part of a memory response prediction module of a memory test controller.

3. The apparatus according to claim 2, wherein said memory test controller is configured to (i) present one or more test sequences and one or more expected data values to a plurality of memory collar circuits and (ii) receive one or more responses from said plurality of memory collar circuits.

4. The apparatus according to claim 3, wherein said memory test controller is further configured to compress or encode said one or more test sequences and said one or more expected data values.

5. The apparatus according to claim 4, wherein said plurality of memory collar circuits are further configured to expand or decode said one or more test sequences and said one or more expected data values.

6. The apparatus according to claim 3, wherein said one or more test sequences comprise a march type memory test sequence.

7. The apparatus according to claim 3, wherein each of said plurality of memory collar circuits is coupled to a respective memory circuit, each respective memory circuit is independently sized and said memory test controller provides a common testing sequence to each of said plurality of memory collar circuits.

8. The apparatus according to claim 7, wherein:
  a first memory collar circuit generates a first set of test vectors for testing a first respective memory in response to said common testing sequence and said expected data values; and
  a second memory collar circuit generates a second set of test vectors for testing a second respective memory in response to said common testing sequence and said expected data values.

9. The apparatus according to claim 7, wherein each of said plurality of memory collar circuits determines whether a memory output, received from the respective memory in response to custom test vectors generated by the respective memory collar circuit based upon the expected data values, is correct based upon said one or more expected data values.

10. The apparatus according to claim 1, wherein said address locator circuit operates using modulo 8 addressing.

11. The apparatus according to claim 1, further comprising:
  a delay element configured to generate a comparison enable flag in response to said first port enable signal;
  a first checkerboard circuit configured to generate a test data signal in response to said data input signal;
  a second checkerboard circuit configured to present a first transformed data signal in response to said first data output signal;
  a third checkerboard circuit configured to present a second transformed data signal in response to said second data output signal; and
  a multiplexer circuit configured to select between said first and said second transformed data signals for presentation as expected data values in response to an active port flag.

12. An apparatus comprising:
  means for generating a current address signal, a first data output signal and a second data output signal in response to a first port address signal, a second port address signal, an initial state parameter, a target state parameter, a first port enable signal, a second port enable signal, a write enable signal, a data input signal, a first location signal and a second location signal; and
  means for generating said first location signal and said second location signal in response to said first port address signal, said second port address signal and said current address signal.

13. A method of generating test sequences for memory built-in self testing comprising:
  generating a current address signal, a first data output signal and a second data output signal in response to a first port address signal, a second port address signal, an initial state parameter, a target state parameter, a first port enable signal, a second port enable signal, a write enable signal, a data input signal, a first location signal and a second location signal; and generating said first location signal and said second location signal in response to said first port address signal, said second port address signal and said current address signal.

14. The method according to claim 13, further comprising:

presenting a common testing sequence and one or more expected data values to a plurality of memory collar circuits based upon said first data output signal, said second data output signal and said data input signal; and receiving one or more responses from said plurality of memory collar circuits.

15. The method according to claim 14, further comprising compressing or encoding said common testing sequence and said one or more expected data values.

16. The method according to claim 15, wherein said common testing sequence and said one or more expected data values are expanded or decoded by said plurality of memory collar circuits.

17. The method according to claim 14, wherein said common testing sequence comprise a march type memory test sequence.

18. The method according to claim 14, wherein each of said plurality of memory collar circuits is coupled to a respective memory circuit, each respective memory circuit is independently sized and said common testing sequence are memory independent.

19. The method according to claim 18, further comprising:

generating a first set of test vectors for testing a first memory in response to said common testing sequence and said expected data values;

generating a second set of test vectors for testing a second memory in response to said common testing sequence and said expected data values; and determining whether an output generated by the first memory in response to the first set of test vectors and an output generated by the second memory in response to the second set of test vectors are correct based upon said one or more expected data values.

20. The method according to claim 13, wherein said first location signal and said second location signal are determined using modulo 8 addressing.

* * * * *